(12) United States Patent
Pan et al.

(10) Patent No.: US 10,897,559 B2
(45) Date of Patent: Jan. 19, 2021

(54) CAMERA AND PHOTOGRAPHY ASSEMBLY

(71) Applicant: SZ DJI TECHNOLOGY CO., LTD., Shenzhen (CN)

(72) Inventors: Dahu Pan, Shenzhen (CN); Xingwang Xu, Shenzhen (CN); Zihan Chen, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/366,613

(22) Filed: Mar. 27, 2019

(65) Prior Publication Data

US 2019/0222726 A1 Jul. 18, 2019

Related U.S. Application Data

(63) Continuation of application No. PCT/CN2016/100449, filed on Sep. 27, 2016.

(51) Int. Cl.
*H04N 5/225* (2006.01)
*F16M 11/12* (2006.01)
*H05K 1/02* (2006.01)
*G02B 7/02* (2006.01)
*G03B 17/02* (2006.01)
*G03B 17/00* (2006.01)

(52) U.S. Cl.
CPC ......... *H04N 5/2252* (2013.01); *F16M 11/123* (2013.01); *G02B 7/02* (2013.01); *G03B 17/00* (2013.01); *G03B 17/02* (2013.01); *H04N 5/2254* (2013.01); *H05K 1/0274* (2013.01)

(58) Field of Classification Search
CPC .. H04N 5/2252; H04N 5/2254; H04N 5/2251; G03B 17/00; G03B 17/02; G03B 2217/002; F16M 11/123; H05K 1/0274; G02B 7/02
See application file for complete search history.

(56) References Cited

U.S. PATENT DOCUMENTS 6,359,740 B1 3/2002 Tsuchiya
6,992,722 B2 * 1/2006 Jung ................ G08B 13/19619
348/151
7,595,875 B1 * 9/2009 Mitchell .................. G01J 3/02
356/328

(Continued)

FOREIGN PATENT DOCUMENTS

CN 101075011 A 11/2007
CN 102129150 A 7/2011
(Continued)

OTHER PUBLICATIONS

World Intellectual Property Organization (WIPO) International Search Report and Written Opinion for PCT/CN2016/100449 dated May 3, 2017 8 Pages.

*Primary Examiner* — Twyler L Haskins
*Assistant Examiner* — Angel L Garces-Rivera
(74) *Attorney, Agent, or Firm* — Anova Law Group, PLLC (57) ABSTRACT

A camera includes a housing, a lens assembly accommodated in the housing, a connection rod, and a circuit board. One end of the connection of the connection rod fixes the lens assembly in the housing. The circuit board is accommodated in the housing and supported by another end of the connection rod. The circuit board is spaced apart from the lens assembly.

20 Claims, 5 Drawing Sheets

(56) References Cited

U.S. PATENT DOCUMENTS 7,692,719 B2 * 4/2010 Kim .................. G02B 7/10
   348/143
2016/0112607 A1   4/2016 Yang

FOREIGN PATENT DOCUMENTS

| CN | 102340622 A | 2/2012 |
| CN | 102566208 A | 7/2012 |
| CN | 203883919 U | 10/2014 |
| CN | 104254200 A | 12/2014 |
| CN | 205484995 U | 8/2016 |
| WO | 2016045009 A1 | 3/2016 |

* cited by examiner

CAMERA AND PHOTOGRAPHY ASSEMBLY

CROSS-REFERENCE TO RELATED APPLICATION

This application is a continuation application of International Application No. PCT/CN2016/100449, filed on Sep. 27, 2016, the entire contents of which are incorporated herein by reference.

TECHNICAL FIELD

This disclosure relates to a camera and a photography assembly including the camera.

BACKGROUND

Modern cameras have more functions than old cameras and include more electronic elements. Some cameras need to have two or more circuit boards installed to mount electronic elements. Currently, multiple circuit boards of a camera are just simply fixed at the camera's housing and space of the camera is not well employed, resulting in a large volume of the camera and hence the camera is not easy to carry. In addition, having multiple circuit boards results in a high requirement on assembly and a complicated process. During the assembly process, the circuit and/or electronic elements of the circuit board are easy to be damaged.

SUMMARY

In accordance with the disclosure, there is provided a camera. The camera includes a housing, a lens assembly accommodated in the housing, a connection rod, and a circuit board. One end of the connection of the connection rod fixes the lens assembly in the housing. The circuit board is accommodated in the housing and supported by another end of the connection rod. The circuit board is spaced apart from the lens assembly.

Also in accordance with the disclosure, there is provide a photographing assembly. The photographing assembly includes a stabilization gimbal and a camera coupled to the gimbal. The camera includes a housing, a lens assembly accommodated in the housing, a connection rod, and a circuit board. One end of the connection of the connection rod fixes the lens assembly in the housing. The circuit board is accommodated in the housing and supported by another end of the connection rod. The circuit board is spaced apart from the lens assembly.

REFERENCE NUMERALS FOR MAIN COMPONENTS

Camera 100, 100'
Housing 10
Accommodation assembly 11
Accommodation space 11a
First accommodation member 111
Bottom wall 1111
Side wall 1112
Second accommodation member 112
First connection member 113
Second connection member 114
Cap 12
Connection hole 121
Connection rod 13, 13'
First connection section 131
Second connection section 132
Female screw hole 1321
Groove 1322
Abutment 133
Step member 134
Support 14
Jack 141
Lens assembly 20
Lens barrel 21
Lens mount 22
Connection flake 221
Perforation hole 2211
Image sensing board 23
Avoidance 231
First fastener 24
Circuit board 30
Through hole 31
Second circuit board 32
Adapter 40
First adapter 401
Second adapter 402
Third adapter 403
Spacer 50
First spacer 51
Second spacer 52
Second fastener 60
Stabilization gimbal 200

DETAILED DESCRIPTION

Technical solutions of the present disclosure will be described with reference to the drawings. It will be appreciated that the described embodiments are some rather than all of the embodiments of the present disclosure. Other embodiments conceived by those having ordinary skills in the art on the basis of the described embodiments without inventive efforts should fall within the scope of the present disclosure.

As used herein, when a first component is referred to as "fixed to" a second component, it is intended that the first component may be directly attached to the second component or may be indirectly attached to the second component via another component. When a first component is referred to as "connecting" to a second component, it is intended that the first component may be directly connected to the second component or may be indirectly connected to the second component via a third component between them. When a first component is referred to as "disposed" to a second component, it is intended that the first component may be directly connected to the second component or may be indirectly connected to the second component via a third component between them. The terms "perpendicular," "horizontal," "left," "right," and similar expressions used herein are merely intended for description.

Unless otherwise defined, all the technical and scientific terms used herein have the same or similar meanings as generally understood by one of ordinary skill in the art. As described herein, the terms used in the specification of the present disclosure are intended to describe example embodiments, instead of limiting the present disclosure. The term "and/or" used herein includes any suitable combination of one or more related items listed.

FIGS. 1-4 schematically show an example of a camera 100 according to some embodiments, the camera 100 is configured for photographing pictures and/or videos. A user can hold the camera 100 to take pictures or videos with or without a stabilization gimbal 200. A photography assembly including the camera 100 and the stabilization gimbal 200 can be loaded at a carrier (not shown), which can be any fixed or movable object, such as a building, a vehicle, a person, an animal, etc. In some embodiments of the present disclosure, the carrier is an unmanned aerial vehicle, by which the photography assembly is carried to perform an aerial photography.

The stabilization gimbal 200 can stabilize photographing and/or adjust directions and angles of the camera 100. The stabilization gimbal 200 may be a three-axis, a two-axis, or a single-axis gimbal. In some embodiments of the present disclosure, the stabilization gimbal is a three-axis gimbal, which can adjust the camera at directions of the three axes (Pitch, Roll, and Yaw). The stabilization gimbal has axial drive motors at directions of three axes. Only one of the axial dive motors of the stabilization gimbal is shown in figures according to embodiments of the present disclosure.

The camera 100 can be configured to acquire images and/or videos and may be a digital single-lens reflex (SLR) camera, a surveillance camera, a portable compact camera, a video camera, or other electronic device with an image/video acquisition function. In some embodiments, the camera 100 has an image processing function such as image segmentation, image synthesis, beautifying, white balance, image stabilization, etc.

The camera 100 includes a housing 10, a lens assembly 20, and a circuit board 30. The lens assembly 20 is connected to the housing 10, and the circuit board 30 is accommodated by the housing 10.

The housing 10 is configured to accommodate the lens assembly 20, the circuit board 30, and various types of electronic elements disposed at the circuit board 30. The housing 10 includes an accommodation assembly 11 and a cap 12, and the circuit board 30 is accommodated by the accommodation assembly 11. The cap 12 can seal the housing 10 by capping the accommodation assembly 11 to protect the circuit board 30 and electronic elements of various types that are disposed at the circuit board 30.

The accommodation assembly 11 has a hollow structure, an internal space thereof forms an accommodation space 11a for accommodating the circuit board 30 and the lens assembly 20. In some embodiments of the present disclosure, the accommodation assembly 11 includes a first accommodation member 111 and a second accommodation member 112. The first accommodation member 111 is an approximately square groove and includes a bottom wall 1111 and side walls 1112 connected to the bottom wall 1111. The bottom wall 1111 and the side walls 1112 together define a first accommodation space (not shown). The side walls 1112 can be an approximately square frame, which is about perpendicularly connected to the bottom wall 1111 in some embodiments of the present disclosure. The second accommodation member 112 can be approximately hollow columnar in shape and protrudes from the bottom wall 1111. The second accommodation member 112 includes a second accommodation space (not shown). The first accommodation space and the second accommodation space together constitute the accommodation space 11a.

In some embodiments of the present disclosure, the second accommodation member 112 and the first accommodation member 111 are integrally formed. The first accommodation member 111 and the second accommodation member 112 may also be formed separately, and connected to each other by screw connecting, engaging, gluing, etc.

Figure 1:
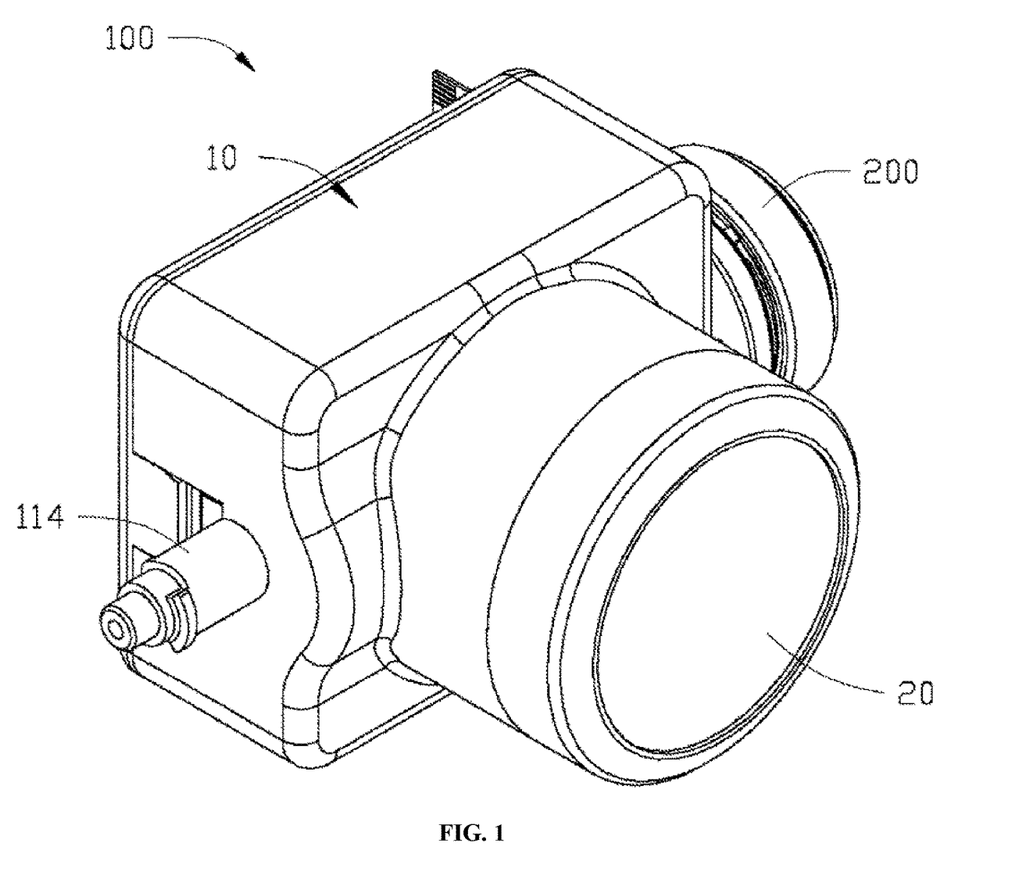
FIG. 1 is a perspective view of an example of a camera according to some embodiments of the present disclosure.
Figure 2:
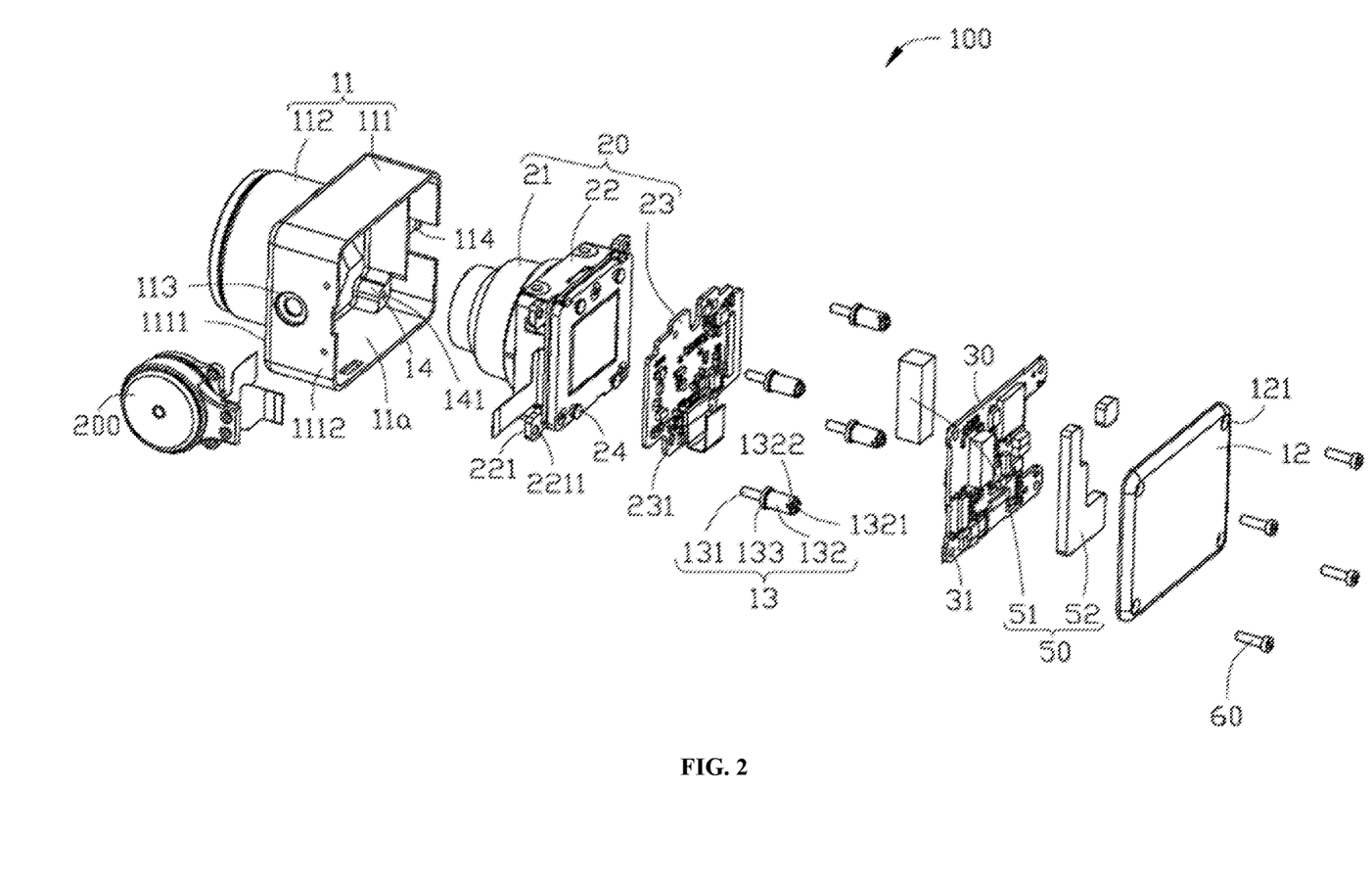
FIG. 2 is an exploded view of the camera in FIG. 1.
Figure 3:
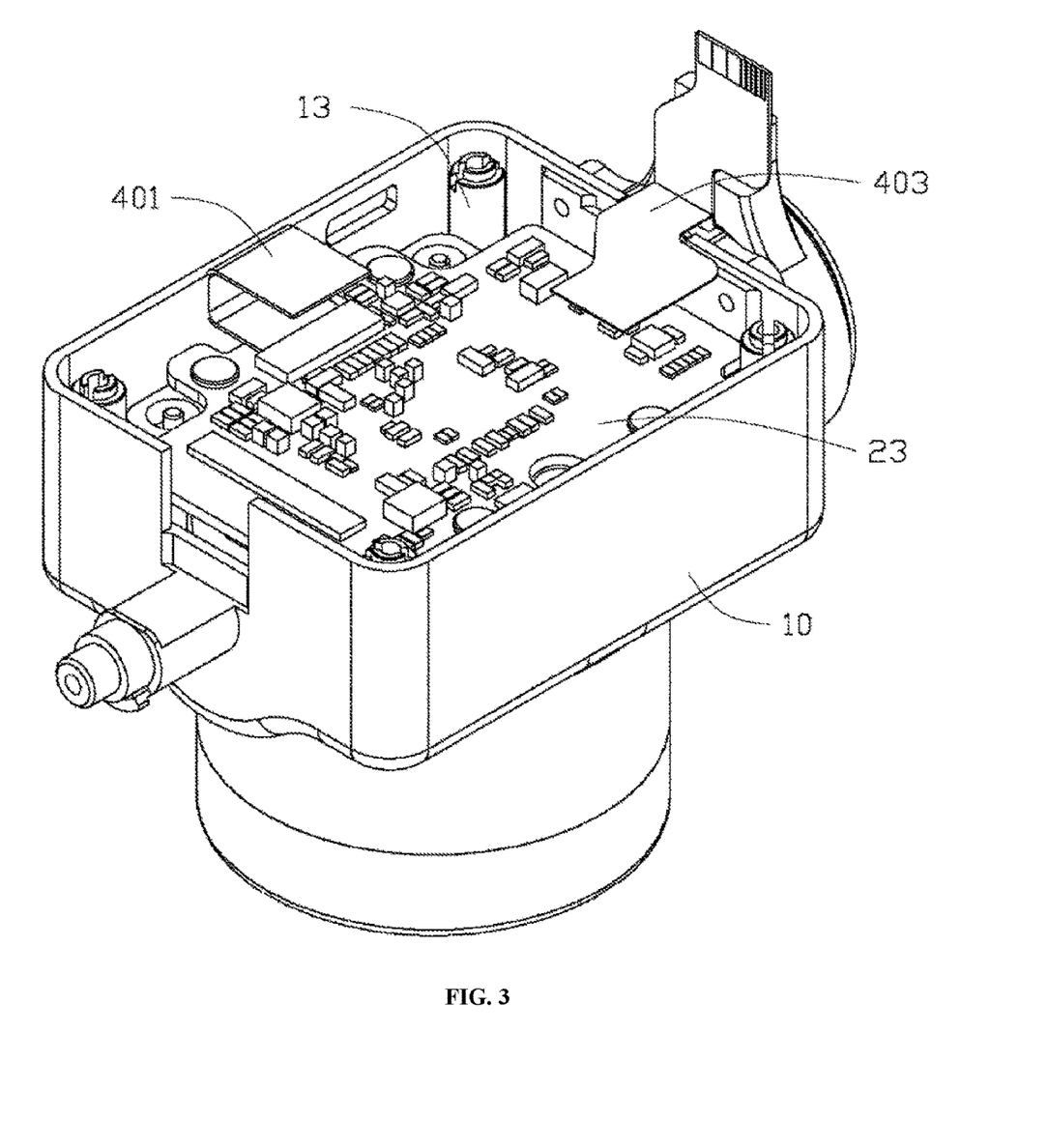
FIG. 3 and FIG. 4 are perspective views of partial structures of the camera in FIG. 1.
Figure 4:
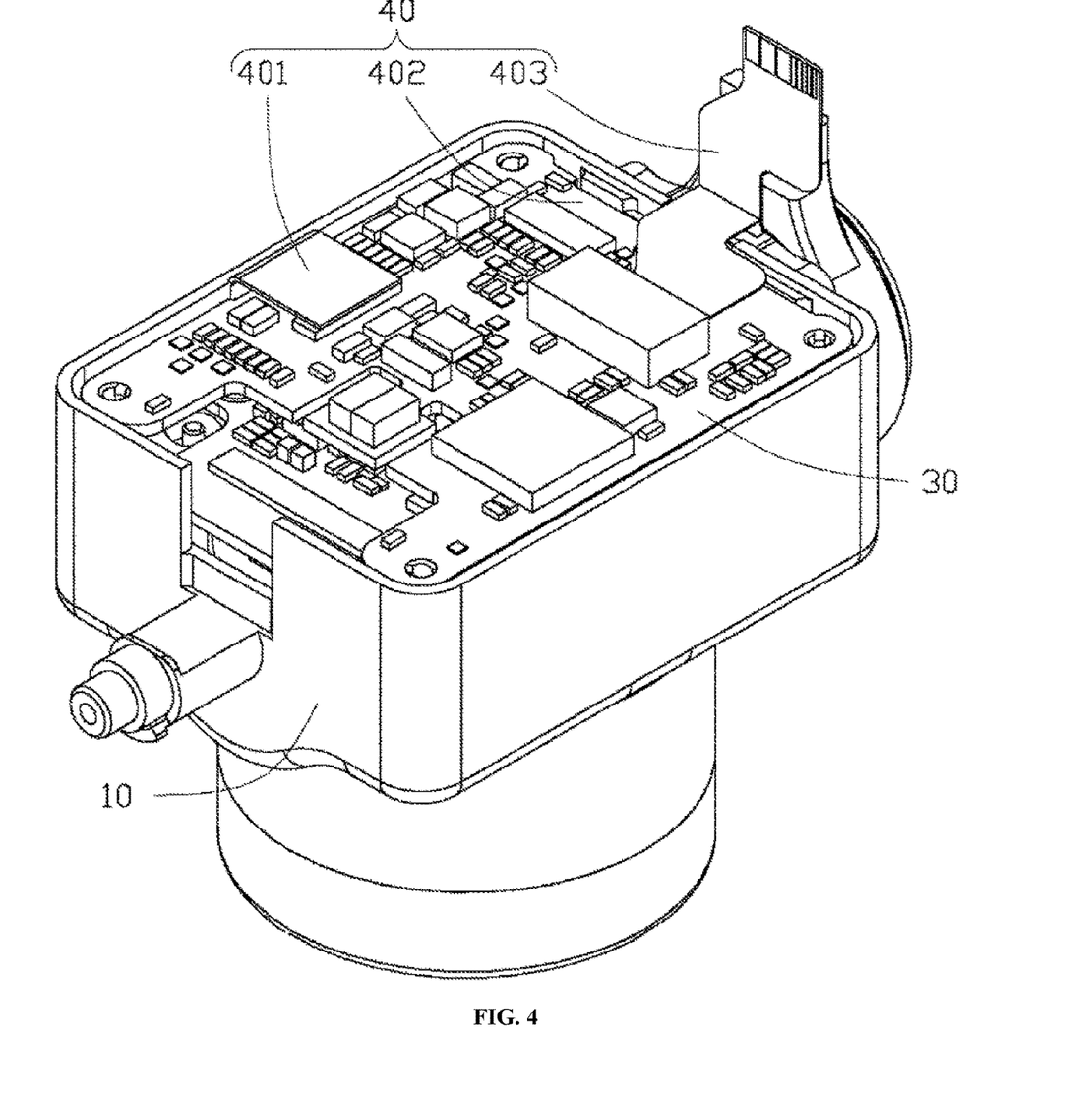

In some embodiments of the present disclosure, as shown in, e.g., FIG. 2, the accommodation assembly 11 includes a first connection member 113 and a second connection member 114. The first connection member 113 is configured to connect with an axial drive motor of the stabilization gimbal 200. The second connection member 114 is approximately shaft shaped and configured to pivotally connect with a support (not shown) of the stabilization gimbal 200. The first connection member 113 and the second connection member 114 are disposed at opposite sides of the housing 10. The first connection 113 and second connection 114 member are respectively formed at opposite side walls 1112 of the first accommodation member 111.

The housing 10 also includes connection rods 13 and support members 14. The connection rods 13 are configured to connect the accommodation assembly 11 with the cap 12. In some embodiments of the present disclosure, each of the connection rods 13 is disposed in the first accommodation member 111 and near one of the side walls 1112. In the embodiments shown in the figures, there are four connection rods, disposed at the four corners of the accommodation assembly 11, respectively. A number of the connection rods 13 may be changed according to actual requirements. For example, the number of the connection rods 13 may be two, three, five, six, etc.

A connection rod 13 includes a first connection section 131, a second connection section 132, and an abutment 133 (abutting section) located between the first connection section 131 and the second connection section 132. In some embodiments of the present disclosure, the first connecting section 131 includes a male screw stud, while the second connection section 132 includes a cylinder with a female screw hole 1321. A groove 1322 is also disposed at an end surface of the second connection section 132. The groove 1322 can cooperate with an installation tool (e.g. a screwdriver), such that the connection rods 13 can be installed by the installation tool. In some embodiments of the present disclosure, the groove 1322 is a slotted groove. The groove 1322 can alternatively be, e.g., a cross shaped groove, a triangular groove, or a rectangular groove, etc., to match a different installation tool. In some embodiments, there may be also a protrusion with one of the above-mentioned shapes at the end face of the second connection section 132.

In some embodiments of the present disclosure, the abutment 133 is an annular flange between the first connection section 131 and the second connection section 132. The abutment 133, the first connection section 131, and the second connection section 132 are integrally formed. The shape of the abutment 133 can be changed according to different requirements but not limited to the illustrated embodiments.

In some embodiments of the present disclosure, the second connection section 132 has a diameter greater than that of the first connection section 131. When the diameter of the second connection section 132 is larger than a predetermined value, the second connection section 132 itself can be an abutment without the need for the abutment 133.

The number of the support members 14 corresponds to the number of the connection rods 13. The support members 14 are configured to mount the lens assembly 20 and connect to the connection rods 13. In some embodiments of the present disclosure, the support members 14 are formed at corners of the first accommodation member 111. The support members 14 protrude from a surface of the bottom wall 1111, e.g., protruding from an inner wall of the accommodation assembly 11. In some embodiments, each of the support members 14 includes an annular flange. The number of the support members 14 can be adjust according to actual needs, and can be, e.g., two, three, four, five, six, etc. A support member 14 may be an integral annular protruding structure. A protruding height of a support member 14 can be adjusted according to the actual situation and the disclosure is not limited thereto.

The support members 14 may alternatively be formed at other positions of the housing 10, for example, at the side walls 1112, or at both of the side walls 1112 and the bottom wall 1111.

A jack 141 is formed at a surface of each support member 14. A jack 141 corresponds to one of the connection rods 13. In some embodiments of the present disclosure, the jack 141 includes a female screw hole matching the external threads of the first connection section 131.

The cap 12 includes connection holes 121 corresponding to the connection rods 13. When the cap 12 caps at the accommodation assembly 11, the connection holes can align with the female screw holes 1321 of the connection rods 13.

The lens assembly 20 is configured to capture light of a photographing scene and focus the light to an image sensor (not shown) for imaging. The lens assembly 20 may be a fixed-focal-length lens assembly (prime lens assembly), a zoom lens assembly, a wide-angle lens assembly, an ultra-wide-angle lens assembly (fisheye lens assembly), or a telephoto lens assembly, etc.

In some embodiments of the present disclosure, the lens assembly 20 includes a lens barrel 21, a lens mount 22 connected to the lens barrel 21, and an image sensing board 23 disposed at the lens mount 22. The lens barrel 21 and the image sensing board 23 are respectively connected to opposite sides of the lens mount 22.

Optical lens(es) are arranged in the lens barrel 21, which are configured to capture light of the photographing scene and focus the light to the image sensor. Besides the optical lenses, other optical element(s) can also be arranged in the barrel 21, such as focusing mechanism(s), filter(s), spacer(s), and/or shading sheet(s), etc.

The lens mount 22 can fix the lens barrel 21 and the image sensing board 23, and allow the light transmitting through the lens barrel 21 to be projected onto the image sensor for imaging. In some embodiments of the present disclosure, the lens mount 22 is approximately in a square shape and includes connection flakes 221 corresponding to the support members 14. The connection flakes 221 protrude from circumferential sides of the support members 14, and each of the connection flakes 221 has a perforation hole 2211. The connection flakes 221 can abut against the corresponding support members 14 and align with the jacks 141.

The image sensing board 23 includes a circuit board carrying the image sensor of the lens assembly 20. Avoidances 231 (avoiding members) corresponding to the connection rods 13 are disposed at the image sensing board 23. Each of the avoidances 231 includes a cutout corresponding to the shape of a side of the connection rods 13. When the lens assembly 20 is installed in the housing 10, the avoidances 231 can prevent the position of the image sensing board 23 from interfering with the position of the connection post 13, thereby facilitating the installation of the lens mount 22. The damage of the image sensing board 23 and the electronic elements of the image sensing board 23 can also be avoided, which may be caused by that the image sensing board 23 cannot tilt as the lens barrel 21 tilts during the installation and application process. The image sensing board 23 abuts against a side surface of the lens mount 22 distal from the lens barrel 21. In some embodiments of the present disclosure, the image sensing board 23 is fixedly connected to the lens mount 22 through first fasteners 24, each of which includes a bolt. In some embodiments, as shown in, e.g., FIG. 2, there are four first fasteners 24. The number of the first fasteners 24 may not be limited to four and can be less than or more than four. Besides using fasteners, other methods can also be applied to connect the image sensing board 23 with the lens mount 22, such as adhering and engaging, etc. The image sensor is disposed at a side surface of the image sensing board 23 facing the lens assembly 20 and aligned with an optical axis of the lens assembly 20.

The circuit board 30 is configured to process and transmit electrical signals. The circuit board 30 includes image sensors, processors, controllers, memory units, capacitors, resistors, printed circuits, inertial measurement units (IMU), and/or other electronic elements (not shown). The above electronic elements are configured to implement functions of the camera 100, such as image processing, photographing control, data storage, data transmission, etc.

The circuit board 30 abuts against end surfaces of the connection rods 13 facing away from the lens assembly 20 and is spaced apart from the lens assembly 20. In some embodiments of the present disclosure, the circuit board 30 is approximately rectangular, and includes through holes 31 corresponding to the connection rods 13. When the circuit board 30 abuts against the connection rods 13, the through holes 31 are aligned with the corresponding female screw holes 1321.

The camera 100 also includes adapters 40, configured to electrically connect the image sensing board 23 with the circuit board 30, and/or the image sensing board 23 and the circuit board 30 with other devices (e.g., a gimbal, a carrier, etc.). The adapters 40 include a first adapter 401, a second adapter 402, and a third adapter 403. The first adapter 401 and the second adapter 402 are configured to electrically connect the image sensing board 23 to the circuit board 30. One end of the third adapter 403 is connected to the circuit board 30, and the other end of the third adapter 403 extends out of the housing 10 and is electrically connected with another device. In some embodiments of the present disclosure, the first adapter 401, the second adapter 402, and the third adapter 403 include flexible circuit boards, so that they are convenient to install and connect. The first adapter 401, the second adapter 402, and the third adapter 403 may be not limited to the illustrated embodiments, but can be other types of adapters such as cables, etc.

The camera 100 also includes spacers 50, configured to space apart electronic elements of different heights. The spacers 50 can absorb shock and also perform insulation function, thereby avoiding a short circuit of the electronic elements. The spacers 50 include a first spacer 51 and a second spacer 52. The first spacer 51 is disposed between the image sensing board 23 and the circuit board 30, and the second spacer 52 is disposed between the circuit board 30 and the cap 12. The spacers 50 may be made of a flexible or an elastic material. In some embodiments, the first spacer 51 and the second spacer 52 can be made of a same material, such as a foam material.

The spacers 50 may be also made of rubber, sponge, or another material. The materials of the first spacer 51 and the second spacer 52 may also be different.

During an assembly process, the image sensing board 23 is fixed at the lens mount 22, and the lens assembly 20 is mounted in the accommodation assembly 11, with the lens barrel 21 in the second accommodation member 112, and the lens mount 22 in the first accommodation member 111. The connection piece of the lens mount 22 abuts against the support members 14, and the perforation holes 2211 can be aligned correspondingly to the jacks 141. The first connection sections 131 of the connection rods 13 penetrate the perforation holes 2211 and the jacks 141 and connect to the support members 14. With the help of the abutments 133, the lens mount 22 abuts against the support members 14, so that the lens mount 22 is fixed inside the housing 10. Then, the circuit board 30 can be installed in the accommodation assembly 11, abutting against the connection rods 13. The installed circuit board 30 is spaced apart from the image sensing board 23 by the first spacer 51. The through holes 31 are aligned with the female screw holes 1321. Further, the adapters 40 can be connected to the image sensing board 23 and the circuit board 30. Then, the accommodation assembly 11 can be capped with the cap 12. The connection holes 121 are aligned to the through holes 31 of the circuit board 30 and the female crew holes 1321 of the connection rods 13, respectively. Finally, the cap 12 can be fixed on the accommodation assembly 11. In some embodiments of the present disclosure, the cap 12 and the circuit board 30 are fixedly connected to the connection rods 13 by the second fasteners 60, which can be bolts. The second fasteners 60 penetrate through the corresponding connection holes 121 and the through holes 31, and threadedly connect to the connection rods 13. The cap 12 and the circuit board 30 are insulated and spaced apart from each other by the second spacer 52.

The shape of the housing 10 is not limited to the illustrated embodiments, and may be another shape such as a spherical shape, an ellipsoidal shape, etc.

Figure 5:
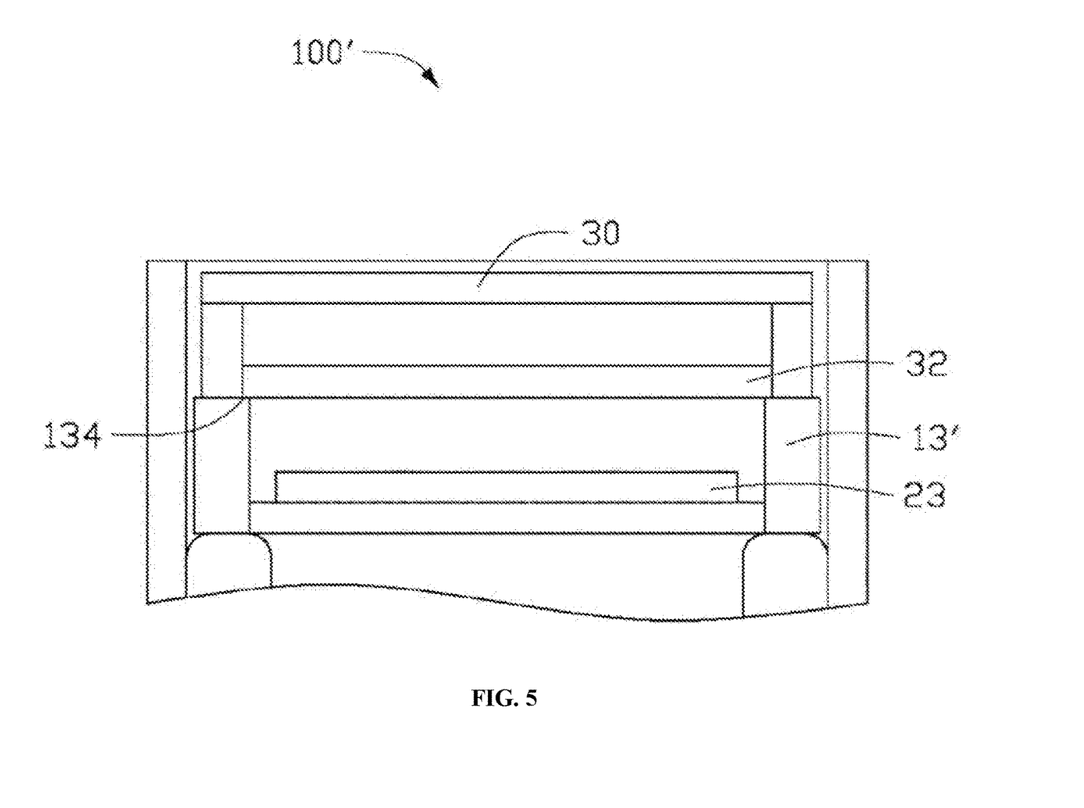
FIG. 5 is a structural diagram of a portion of another example of a camera according to some other embodiments of the present disclosure.

FIG. 5 is a structural diagram of a portion of another example of a camera 100' according to some other embodiments of the present disclosure. The camera 100' is similar to the camera 100 described above in connection with FIGS. 1-4. As shown in FIG. 5, a step member 134 is formed at a peripheral of a connection rods 13' of the camera 100'. The camera 100' also includes a second circuit board 32. The second circuit board 32 abuts against and is fixed at the step members 134. The second circuit board 32, the circuit board 30, and the image sensing board 23 are spaced apart from each other. In some embodiments, the camera 100' may include more circuit boards that can be stacked in layers to better utilize the internal space of the camera 100', and hence the size of the camera can be reduced.

In some embodiments, each connection rod 13' may include multiple step members 134 to mount multiple circuit boards.

The photographing assembly uses connection rods to fix the circuit boards, which not only can reasonably utilize the internal space of the housing, but also can make the circuit boards easy and fast to install and avoid damage to the circuit board and/or the electronic elements of the circuit board during the assembly process.

It is intended that the specification and embodiments be considered as examples only and not to limit the scope of the disclosure. Any modification and equivalently replacement for the technical solution of the present disclosure should all fall in the spirit and scope of the technical solution of the present disclosure.

What is claimed is:

1. A camera comprising:
   a housing;
   a lens assembly accommodated in the housing and including an image sensing board and a lens barrel;
   a connection rod, one end of the connection rod fixing a portion of the lens assembly in the housing; and
   a circuit board accommodated in the housing and supported by another end of the connection rod, the circuit board being spaced apart from the lens assembly, wherein a portion of the image sensing board is cut out to form an avoidance configured to prevent, during assembly, the image sensing board from interfering with the connection rod to enable the image sensing board to tilt along with the lens barrel.

2. The camera of claim 1, wherein the image sensing board is spaced apart from the circuit board.

3. The camera of claim 2, wherein the circuit board includes an adapter configured to electrically connect the image sensing board to the circuit board.

4. The camera of claim 3, wherein:
   the adapter is a first adapter; and
   the circuit board further includes a second adapter configured to electrically connect the image sensing board to the circuit board.

5. The camera of claim 1, wherein:
   the housing includes an accommodation assembly, the connection rod being disposed in the accommodation assembly; and
   an accommodation space is formed by an interior space of the accommodation assembly and configured to accommodate the lens assembly and the circuit board.

6. The camera of claim 5, wherein:
   the accommodation assembly includes a first accommodation member and a second accommodation member;
   the lens assembly further includes a lens mount connected to the lens barrel; and
   the lens barrel is in the second accommodation member, and the lens mount is in the first accommodation member.

7. The camera of claim 6, wherein:
   a support member is formed in the accommodation assembly; and
   the lens mount abuts against the support member and is fixedly connected to the support member through the connection rod.

8. The camera of claim 7, wherein:
   the support member includes an annular flange protruding from an inner wall of the accommodation assembly; or
   the support member is one of a plurality of support members separated from each other and each including a protrusion protruding from the inner wall of the accommodation assembly.

9. The camera of claim 6, wherein the image sensing board is fixedly coupled to a side surface of the lens mount by a fastener, the side surface of the lens mount facing away from the lens barrel.

10. The camera of claim 9, wherein the avoidance corresponds to the connection rod and is configured to allow the image sensing board to avoid the connection rod during a process of assembling the lens assembly to the housing.

11. The camera of claim 10, wherein the avoidance includes a cutout corresponding to a shape of a side of the connection rod.

12. The camera of claim 5, wherein:
the housing includes a cap configured to seal the housing by being connected to the accommodation assembly through a fastener corresponding to the connection rod; and
the fastener penetrates through the housing and connects to the connection rod.

13. The camera of claim 1, wherein:
a step member is formed at a peripheral of the connection rod; and
the circuit board is a first circuit board;
the camera further comprising:
a second circuit board abutting against and fixed to the step member, and being spaced apart from the lens assembly and the first circuit board.

14. The camera of claim 1, further comprising:
a spacer assembly configured to separate the circuit board from the lens assembly.

15. A photographing assembly comprising:
a stabilization gimbal; and
a camera coupled to the gimbal and including:
 a housing;
 a lens assembly accommodated in the housing and including an image sensing board and a lens barrel;
 a connection rod, one end of the connection rod fixing a portion of the lens assembly in the housing; and
 a circuit board accommodated in the housing and supported by another end of the connection rod, the circuit board being spaced apart from the lens assembly, wherein a portion of the image sensing board is cut out to form an avoidance configured to prevent, during assembly, the image sensing board from interfering with the connection rod to enable the image sensing board to tilt along with the lens barrel.

16. The photographing assembly of claim 15, wherein the image sensing board is spaced apart from the circuit board.

17. The photographing assembly of claim 16, wherein the circuit board includes an adapter configured to electrically connect the image sensing board to the circuit board.

18. The photographing assembly of claim 15, wherein:
the housing includes an accommodation assembly, the connection rod being disposed in the accommodation assembly; and
an accommodation space is formed by an interior space of the accommodation assembly and configured to accommodate the lens assembly and the circuit board.

19. The photographing assembly of claim 18, wherein:
the accommodation assembly includes a first accommodation member and a second accommodation member;
the lens assembly further includes a lens mount connected to the lens barrel; and
the lens barrel is in the second accommodation member, and the lens mount is in the first accommodation member.

20. The photographing assembly of claim 15, wherein the housing comprises:
a first connection member configured to connect an axial drive motor of the stabilization gimbal; and
a second connection member configured to pivotally connect with a support of the stabilization gimbal.

* * * * *